(12) United States Patent
Lim et al.

(10) Patent No.: US 9,831,292 B2
(45) Date of Patent: Nov. 28, 2017

(54) ORGANIC LIGHT-EMITTING DISPLAY APPARATUS AND METHOD OF MANUFACTURING THE SAME

(71) Applicant: Samsung Display Co., Ltd., Yongin (KR)

(72) Inventors: Jaeik Lim, Yongin (KR); Hongshik Shim, Yongin (KR); Jinwoo Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/722,203

(22) Filed: May 27, 2015

(65) Prior Publication Data

US 2016/0079311 A1   Mar. 17, 2016

(30) Foreign Application Priority Data

Sep. 12, 2014  (KR) .................. 10-2014-0121267

(51) Int. Cl.
*H01L 27/32* (2006.01)
*H01L 51/52* (2006.01)

(52) U.S. Cl.
CPC ........ *H01L 27/322* (2013.01); *H01L 27/3211* (2013.01); *H01L 51/5275* (2013.01); *H01L 51/5284* (2013.01); *H01L 27/3244* (2013.01); *H01L 51/524* (2013.01); *H01L 2251/5315* (2013.01)

(58) Field of Classification Search
CPC combination set(s) only.
See application file for complete search history.

(56) References Cited

U.S. PATENT DOCUMENTS

| | | | |
|---|---|---|---|
| 8,022,620 B2 | 9/2011 | Kobayashi | |
| 2005/0274968 A1* | 12/2005 | Kuo | H01L 27/14621 257/98 |
| 2007/0279560 A1 | 12/2007 | Ishitani et al. | |
| 2009/0034083 A1* | 2/2009 | Li | G02B 3/0031 359/619 |
| 2011/0025199 A1* | 2/2011 | Park | H01L 51/5284 313/504 |

FOREIGN PATENT DOCUMENTS

| | | |
|---|---|---|
| JP | 2008-210740 | 9/2008 |
| KR | 10-2007-0115751 | 12/2007 |
| KR | 10-2008-0040850 | 5/2008 |
| KR | 10-2009-0046100 | 5/2009 |
| KR | 10-2013-0075428 | 7/2013 |

* cited by examiner

*Primary Examiner* — Kyoung Lee
*Assistant Examiner* — Ratisha Mehta
(74) *Attorney, Agent, or Firm* — H.C. Park & Associates, PLC

(57) ABSTRACT

An organic light-emitting display apparatus includes: an organic light-emitting device including a plurality of sub-pixels respectively emitting lights of different colors; a color filter formed on the organic light-emitting device in a region corresponding to each of the sub-pixels; a spacer color filter formed in the color filter between red, green, and blue color filters at locations corresponding to non-emitting areas; and a substrate provided on the color filter to encapsulate the organic light-emitting device.

16 Claims, 8 Drawing Sheets

US 9,831,292 B2

ORGANIC LIGHT-EMITTING DISPLAY APPARATUS AND METHOD OF MANUFACTURING THE SAME

CROSS REFERENCE TO RELATED APPLICATION

This application claims priority from and the benefit of Korean Patent Application No. 10-2014-0121267, filed on Sep. 12, 2014, which is hereby incorporated by reference for all purposes as if fully set forth herein.

BACKGROUND

Field

Exemplary embodiments of the present invention relate to an organic light-emitting display apparatus and a method of manufacturing the same.

Discussion of the Background

Organic light-emitting display apparatuses are self-emitting display apparatuses that typically do not include a separate light source. Accordingly, the organic light-emitting display apparatuses may be driven at a low voltage, may be lightweight and thin, and may have wide viewing angles, good contrast features, and fast response speeds. Accordingly, organic light-emitting display apparatuses have been highlighted as the next-generation display apparatuses.

However, when light is incident from an external light source on an organic-light emitting display apparatus, reflection occurs due to a refractive index difference between stacked layers in the organic-light emitting display apparatus. Thus, a reduction of the reflection of external light and maximization of the absorption thereof may enhance overall customer experience of the organic-light emitting display apparatuses.

SUMMARY

Exemplary embodiments of the present invention include an organic light-emitting display apparatus and a method of manufacturing the same.

Additional aspects will be set forth in part in the following description and, in part, will be apparent from the description, or may be learned by practice of the presented embodiments.

Exemplary embodiments of the present invention provide an organic light-emitting display apparatus including: an organic light-emitting device including a plurality of sub-pixels respectively emitting lights of different colors; a color filter formed on the organic light-emitting device in a region corresponding to each of the sub-pixels; a spacer color filter formed in the color filter between red, green, and blue color filters at locations corresponding to non-emitting areas; and a substrate provided on the color filter to encapsulate the organic light-emitting device.

An exemplary embodiment of the present invention also discloses an organic light-emitting display apparatus including: an organic light-emitting device including a plurality of sub-pixels respectively emitting lights of different colors; a color filter formed on the organic light-emitting device and located in a region corresponding to each of the sub-pixels; a spacer color filter formed in the color filter between red, green, and blue color filters at locations corresponding to non-emitting areas; a substrate provided on the color filter to encapsulate the organic light-emitting device; and an intermediate layer provided between the color filter and the substrate and having a refractive index between a refractive index of the color filter and a refractive index of the substrate.

An exemplary embodiment of the present invention also discloses a method of manufacturing an organic light-emitting display apparatus including: forming an organic light-emitting device including a plurality of sub-pixels respectively emitting lights of different colors; preparing a substrate for encapsulating the organic light-emitting device; and forming a color filter located on the organic light-emitting device on the substrate in a region corresponding to each of the sub-pixels, wherein the forming of the color filter sequentially includes: patterning a blue color filter in a region corresponding to a blue sub-pixel and a region corresponding to a non-emitting area; patterning a green color filter in a region corresponding to a green sub-pixel; and patterning a red color filter in a region corresponding to a red sub-pixel and a region corresponding to the non-emitting area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
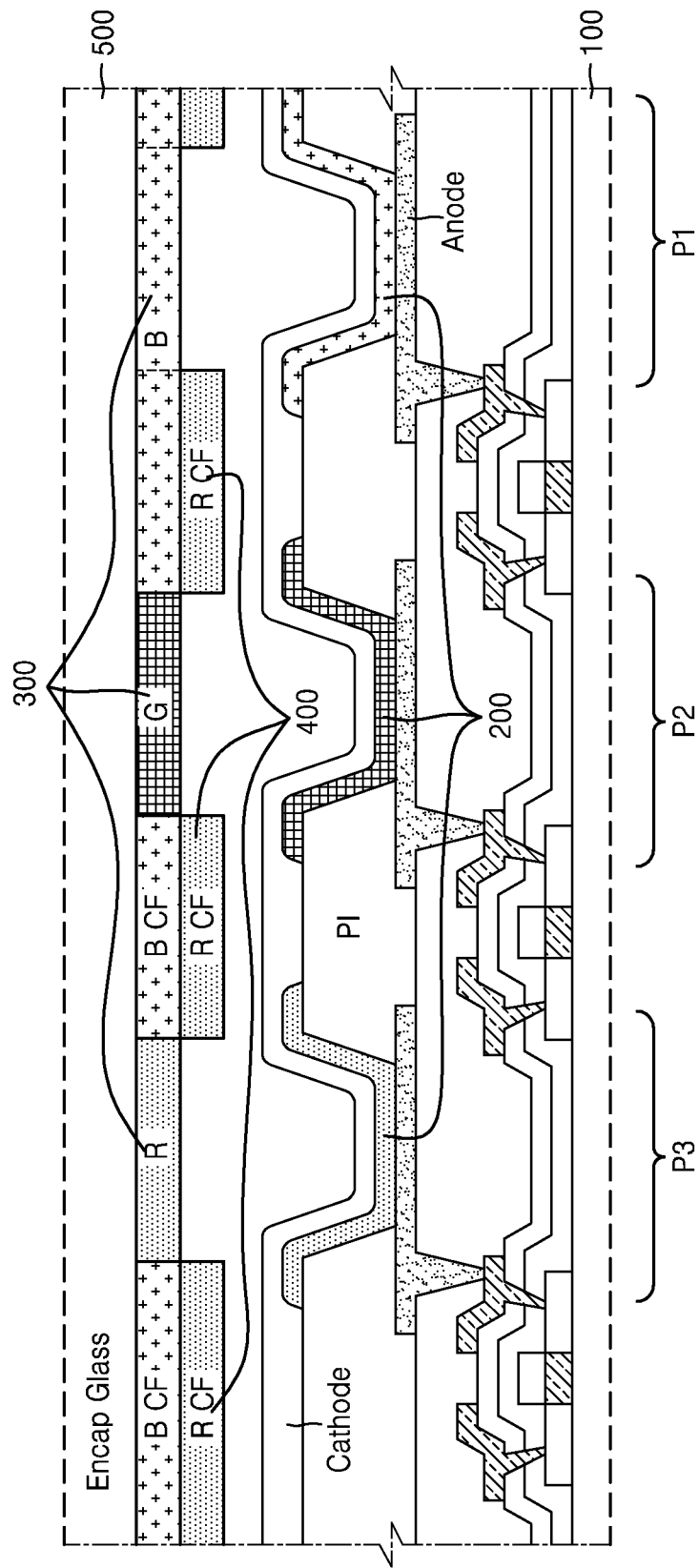
FIG. 1 is a cross-sectional diagram of an organic light-emitting display apparatus according to an exemplary embodiment of the present invention.

The present invention may allow various kinds of change or modification and various changes in form, and specific embodiments will be illustrated in drawings and described in detail in the specification. However, it should be understood that the specific embodiments do not limit the present invention to a specific disclosing form but include every modified, equivalent, or replaced one within the spirit and technical scope of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

The terminology in the application has been used only to describe specific embodiments and does not limit the present invention. In the application, it should be understood that terms, such as 'include' and 'have', are used to indicate the existence of an implemented feature, number, step, operation, element, part, or a combination thereof without excluding in advance the possibility of the existence or addition of one or more other features, numbers, steps, operations, elements, parts, or combinations thereof.

The present invention will now be described more fully with reference to the accompanying drawings, in which exemplary embodiments of the invention are shown.

Figure 2:
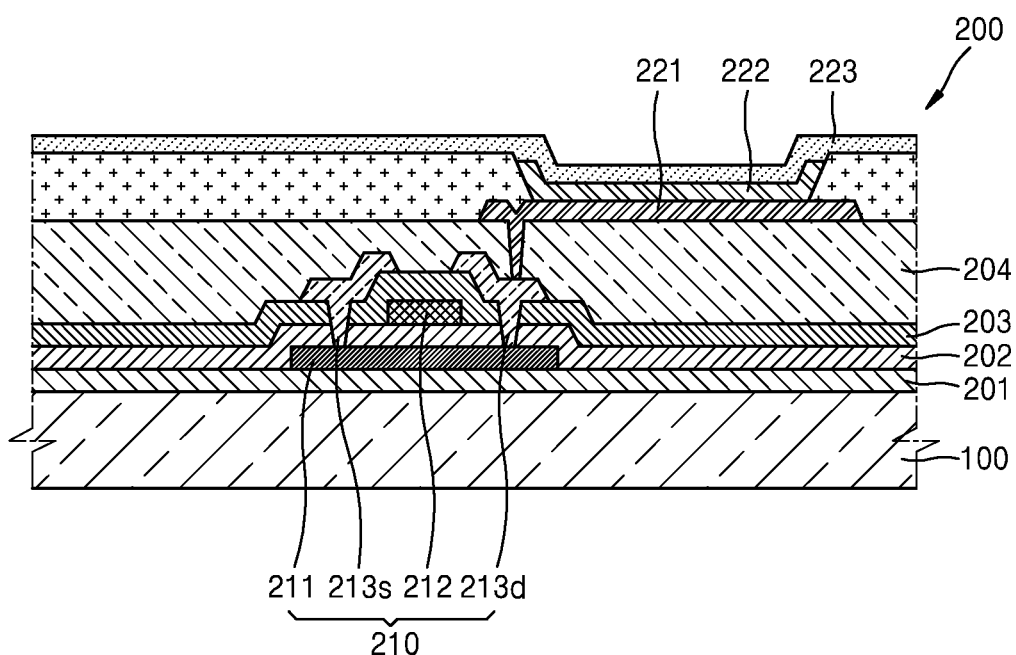
FIG. 2 is a cross-sectional diagram of an organic light-emitting device corresponding to one sub-pixel region in the organic light-emitting display apparatus of FIG. 1.

FIG. 1 is a cross-sectional diagram of an organic light-emitting display apparatus according to an embodiment, and FIG. 2 is a cross-sectional diagram of an organic light-emitting device corresponding to one sub-pixel region in the organic light-emitting display apparatus of FIG. 1.

Referring to FIG. 1, the organic light-emitting display apparatus may include a substrate 100, an organic light-emitting device 200 formed on the substrate 100, a color filter 300, and an upper substrate 500.

The substrate 100 may be formed of a plastic having excellent heat resistance and durability. However, exemplary embodiments are not limited thereto, and the substrate 100 may be formed of various materials such as a metal, glass, and the like.

The organic light-emitting device 200 is formed on the substrate 100 and may include first, second, and third sub-pixels, P1, P2, and P3, respectively, emitting lights of different colors. For example, the organic light-emitting device 200 may include the first sub-pixel P1 emitting blue light, the second sub-pixel P2 emitting green light, and the third sub-pixel P3 emitting red light.

Referring to FIG. 2, the organic light-emitting device 200 may include a buffer layer 201 formed on the substrate 100 to block foreign substances/humidity from entering therein, a thin-film transistor 210 disposed on the buffer layer 201, a first electrode 221 electrically connected to the thin-film transistor 210, a second electrode 223 disposed opposite the first electrode 221, and an intermediate layer 222 interposed between the first and second electrodes 221 and 223 and including an organic emission layer.

The thin-film transistor 210 may include an active layer 211, a gate electrode 212, a source electrode 212$s$, and a drain electrode 212$d$. A first insulating layer is interposed between the gate electrode 212 and the active layer 211 to insulate the gate electrode 212 from the active layer 211. The active layer 211 may include a channel region formed in the center thereof and a source region and a drain region arranged on each side of the channel region, respectively. The active layer 211 may include amorphous silicon, crystalline silicon, or an oxide semiconductor, but is not limited thereto.

The source region and the drain region formed at both sides with respect to the channel region may be formed using the gate electrode 212 as a self-aligned mask and doping high-density impurities. Although FIG. 2 illustrates that the thin-film transistor 210 is of a top gate type, exemplary embodiments are not limited thereto. Thus, the thin-film transistor 210 may be of a top gate type.

The source and drain electrodes 212$s$ and 212$d$ are provided on the gate electrode 212 with a second insulating layer 203 interposed therebetween. The source and drain electrodes 212$s$ and 212$d$ are electrically connected to the source and drain regions of the active layer 211, respectively. A third insulating layer 204 may be formed on the source and drain electrodes 212$s$ and 212$d$.

Any one of the source and drain electrodes 212$s$ and 212$d$ may be electrically connected to the first electrode 221. The intermediate layer 222, which includes an organic emission layer, and the second electrode 223 may be formed on the first electrode 221.

As shown in FIG. 1, each of the first, second, and third sub-pixels P1, P2, and P3 includes the structure shown in FIG. 2, and the organic emission layers included in the intermediate layers 222 of the first, second, and third sub-pixels P1, P2, and P3, respectively, include organic materials for emitting red, green, and blue lights. Each organic emission layer emitting red, green, and/or blue light may include a low- or high-molecular organic material. Depending on an organic emission layer, the intermediate layer 222 may further include at least one selected from the group that includes a hole transport layer, a hole injection layer, an electron transport layer, and an electron injection layer.

Referring back to FIG. 1, the organic light-emitting display apparatus according to an exemplary embodiment of the present invention may have a color filter 300 located on the organic light-emitting device 200 in a region corresponding to the first, second, and third sub-pixels P1, P2, and P3.

An upper substrate 500 for encapsulating the organic light-emitting device 200 may be provided on the color filter 300. The upper substrate 500 may be formed of glass, but is not limited thereto, and the upper substrate 500 may be formed of various materials such as metal, plastic, and the like.

The color filter 300 may include a blue color filter B located in a region corresponding to the first sub-pixel P1, a green color filter G located in a region corresponding to the second sub-pixel P2, and a red color filter R located in a region corresponding to the third sub-pixel P3.

The color filter 300 may be located in a region corresponding to the first, second, and third sub-pixels, P1, P2, and P3, and a spacer color filter 400 may be formed between the red, green, and blue color filters R, G, and B. That is, the spacer color filter 400 may be formed at a location corresponding to a non-emitting area between the first, second, and third sub-pixels P1, P2, and P3.

By forming the spacer color filter 400 at the location corresponding to the non-emitting area, i.e., between the red, green, and blue color filters R, G, and B, only a small amount of external light incident onto the color filter 300 may be reflected, and thus, improving the visibility of the display and also definition of an image displayed.

The spacer color filter 400 may be light-shielding. That is, the spacer color filter 400 may be formed in the non-emitting area, and may include a black matrix for absorbing visible light to reduce contrast due to downward reflection of external light. The downward reflection refers to reflection toward an electrode or a wiring layer of the organic light-emitting device 200 or a lower substrate 100 below the organic light-emitting device 200.

As shown in FIG. 1, the spacer color filter 400 may be formed by stacking a first layer and a second layer, wherein the first layer may be the blue color filter B. Alternatively, the spacer color filter 400 may only include the first layer, but the present embodiment is not limited thereto.

The blue color filter B may have a refractive index that is almost the same as or the same as that of the upper substrate 500, in comparison to that of the green or red color filter G or R. Therefore, the blue color filter B may be stacked and formed as the first layer of the spacer color filter 400.

Light from the outside may be incident on the color filter 300 by passing through the upper substrate 500. In this case, a portion of light incident at the location corresponding to the non-emitting area may be reflected again to the outside, and other portion thereof may be absorbed inside the organic light-emitting display apparatus.

When a refractive index difference between stacked layers at an interface is high, total reflection occurs. That is, when a refractive index difference between neighboring layers is large, it is highly probable that light incident from the outside is totally reflected to the outside.

Therefore, when a refractive index difference between layers through which light incident from the outside passes is small, the probability that light incident from the outside is totally reflected to the outside is low, thereby maximizing the absorption of the incident external light within the organic light-emitting display apparatus.

Accordingly, by stacking the blue color filter B as the first layer of the spacer color filter 400, the organic light-emitting display apparatus of an exemplary embodiment of the present invention may minimize a difference in a refractive index with respect to the upper substrate 500.

That is, light absorbed from the outside sequentially passes through the upper substrate 500 and the blue color filter B. Thus, such a minimized surface reflection allows the organic light-emitting display apparatus to absorb the external incident light.

Thus, a manufacturing process may be simplified by forming the spacer color filter 400 to have light-shielding properties between the red, green, and blue color filters R, G, and B, without separately preparing a light-shielding part.

A process of forming the spacer color filter 400 will be described in detail along with a method of manufacturing an organic light-emitting display apparatus according to an exemplary embodiment of the present invention.

According to the an exemplary embodiment, the spacer color filter 400 may be formed together with the color filter 300 without patterning a separate light-shielding part, thus reducing manufacturing time and costs.

As shown in FIG. 1, the spacer color filter 400 may have the blue color filter B as the first layer, and the red color filter R may be stacked on the blue color filter B.

Since the spacer color filter 400 includes the first and second layers, the region corresponding to the non-emitting area may be formed so as to protrude further than the region of the color filter 300.

Therefore, the spacer color filter 400 may have characteristics of a spacer in the organic light-emitting display apparatus according to the present embodiment.

That is, by stacking the blue color filter B as the first layer on the upper substrate 500 and then stacking the red color filter R thereon as the second layer, an inter-layer refractive index difference may be not only minimized, but also increasing the efficiency of absorbing external light through the first and second layers. By forming the spacer color filter 400 so as to protrude more than the color filter 300, the spacer color filter 400 may be a spacer for maintaining a gap between the upper substrate 500 and the lower substrate 100.

Figure 3:
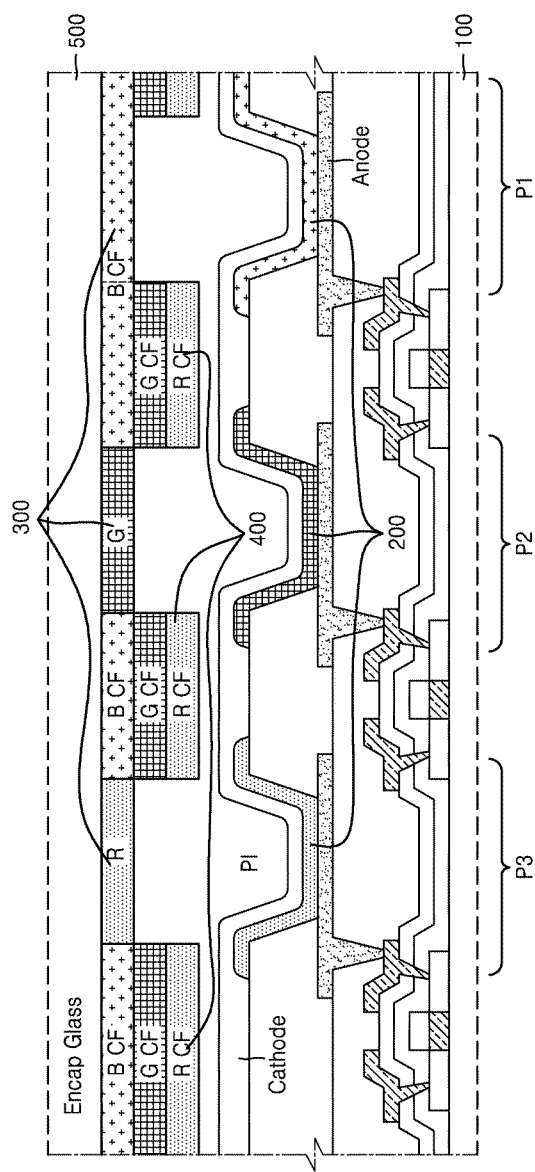
FIG. 3 is a cross-sectional diagram of an organic light-emitting display apparatus according to an exemplary embodiment of the present invention.

FIG. 3 is a cross-sectional diagram of an organic light-emitting display apparatus according to an exemplary embodiment of the present invention.

The spacer color filter 400 in the organic light-emitting display apparatus according to the present embodiment may be formed by stacking first, second, and third layers, as shown in FIG. 3.

The spacer color filter 400 formed at the location corresponding to the mon-emitting area may include the blue color filter B as the first layer, the green color filter G as the second layer, and the red color filter as the third layer, which are sequentially stacked. However, the spacer color filter 400 is not limited to the three stacked layers, and the order of stacking the red, green, and blue color filters R, G, and B is also not limited.

Figure 4:
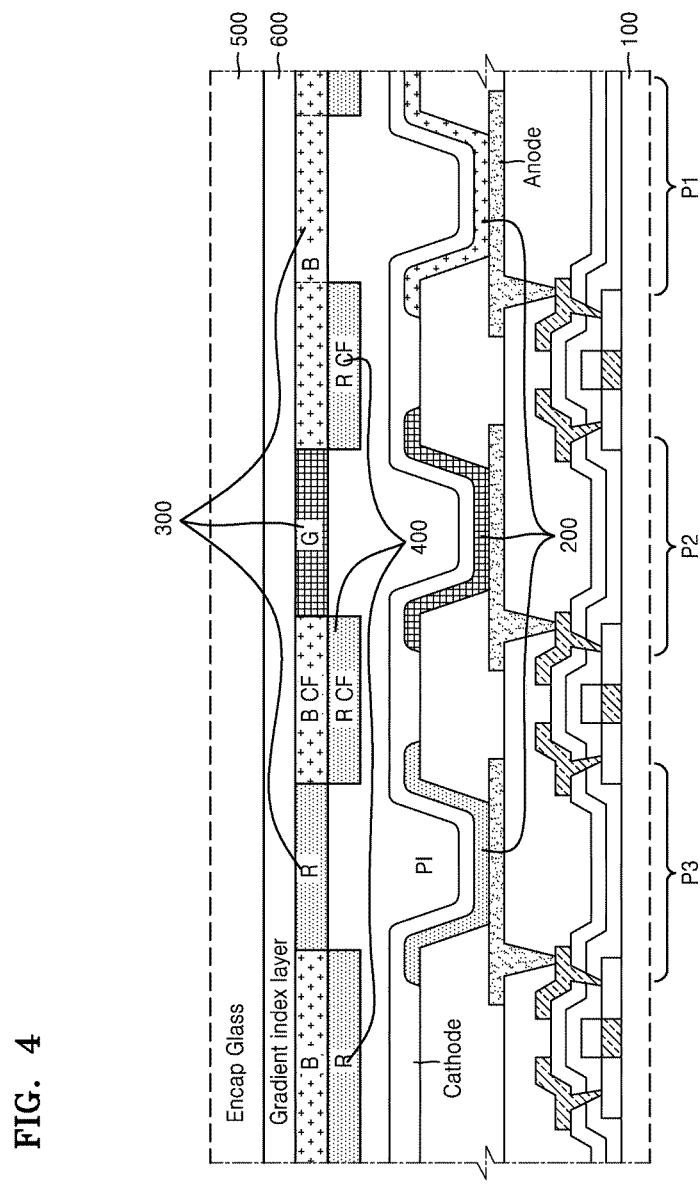
FIG. 4 is a cross-sectional diagram of an organic light-emitting display apparatus according to an exemplary embodiment of the present invention.

FIG. 4 is a cross-sectional diagram of an organic light-emitting display apparatus according to an exemplary embodiment of the present invention.

The organic light-emitting display apparatus according to an exemplary embodiment may further include an intermediate layer (gradient index layer) 600 provided between the color filter 300 and the upper substrate 500.

The intermediate layer 600 may be an intermediate refractive layer between the refractive index of the color filter 300 and the refractive index of the upper substrate 500. The intermediate layer 600 may be a transparent layer since external incident light passes through the color filter 300 after passing through the intermediate layer 600.

The organic light-emitting display apparatus according to exemplary embodiments may include the intermediate layer 600 to prevent reflection of light incident from the outside when the refractive index of the color filter 300 is different from the refractive index of the upper substrate 500.

A refractive index of the intermediate layer 600 may have an intermediate value between the refractive index of the color filter 300 and the refractive index of the upper substrate 500, and thus, an inter-layer refractive index difference may be lowered, thereby minimizing surface reflection.

Light incident from the outside may be absorbed by the organic light-emitting display apparatus by sequentially passing through the upper substrate 500, the intermediate layer 600, and the color filter 300.

Like the organic light-emitting display apparatuses according to the embodiments described above, the organic light-emitting display apparatus according to the present embodiment may also include the spacer color filter 400, as shown in FIG. 4.

As shown in FIG. 4, the spacer color filter 400 may be formed by stacking the first layer and the second layer. However, the present embodiment is not limited thereto, and the spacer color filter 400 may be formed by stacking the first layer, the second layer, and the third layer as described above.

Since the refractive index of the blue color filter B is almost the same as that of the upper substrate 500, the first layer may be formed by stacking the blue color filter B on the upper substrate 500. As shown in FIG. 4, the second layer may be formed by stacking the red color filter R on the blue color filter B.

The spacer color filter 400 may be formed by stacking the first, second, and third layers, wherein the first layer as the blue color filter B, the second layer as the green color layer G, and the third layer as the red color layer R are sequentially provided.

Figure 5:
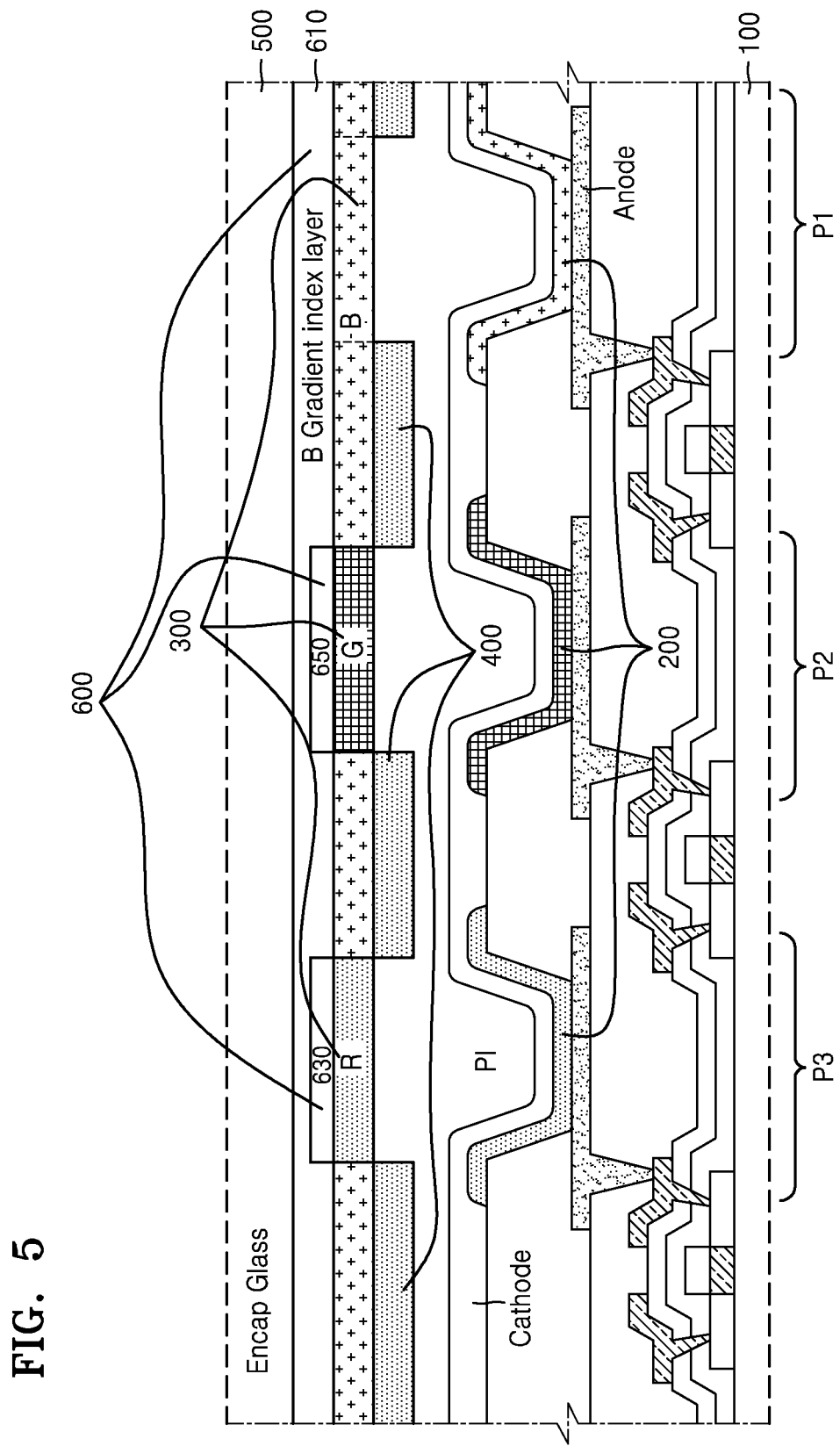
FIG. 5 is a cross-sectional diagram of an organic light-emitting display apparatus according to an exemplary embodiment of the present invention.

FIG. 5 is a cross-sectional diagram of an organic light-emitting display apparatus according to an exemplary embodiment of the present invention.

The organic light-emitting display apparatus according to an exemplary embodiment may include a blue intermediate layer 610 having a refractive index between an intermediate value of the refractive index of the blue color filter B and the refractive index of the upper substrate 500.

A red intermediate layer pattern 630 formed in the blue intermediate layer 610 and located on the red color filter R may be further included in the organic light-emitting display apparatus.

Since the refractive index of the blue color filter B is almost the same with that of the upper substrate 500, the blue intermediate layer 610 may be formed between the upper substrate 500 and the color filter 300.

Thus, in a case where the blue intermediate layer 610 is formed, when light incident from the outside passes through the blue color filter B, an inter-layer refractive index difference is minimized, thereby enhancing the display efficiency.

To minimize a surface reflection of light passing through the red color filter R from outside the device, the red intermediate layer pattern 630 may also be formed as shown in FIG. 5. The red intermediate layer pattern 630 may be located in the blue intermediate layer 610 and may be formed so as to have a refractive index with an intermediate value between the refractive index of the blue intermediate layer 610 and the refractive index of the red color filter R.

Therefore, light incident from the outside may pass through the red color filter R after sequentially passing through the upper substrate 500, the blue intermediate layer 610, and the red intermediate layer pattern 630.

Therefore, since an inter-layer refractive index difference is minimized, even though light passes through a plurality of layers, an amount of reflected light may be minimized, and thus, an amount of light absorbed by the organic light-emitting display apparatus may be large.

Accordingly, external light absorption of the organic light-emitting display apparatus according to an exemplary embodiment of the present invention may be maximized.

As shown in FIG. 5, a green intermediate layer pattern 650 may be further included in the blue intermediate layer 610, specifically, in the green color filter G.

The green intermediate layer pattern 650 may be formed so as to have a refractive index between the refractive index of the blue intermediate layer 610 and the refractive index of the green color filter G.

In this case, outside light incident onto the green color filter G may sequentially pass through the upper substrate 500, the blue intermediate layer 610, and the green intermediate layer pattern 650.

Like the red intermediate layer pattern 630, since an inter-layer refractive index difference is minimized, the amount of light absorbed by the organic light-emitting display apparatus through the green color filter G may be maximized.

The organic light-emitting display apparatus according to exemplary embodiments of the present invention are not limited to the embodiment illustrated in FIG. 5 and may include only the red intermediate layer pattern 630 and the green intermediate layer pattern 650, or both the red intermediate layer pattern 630 and the green intermediate layer pattern 650.

Figure 6:
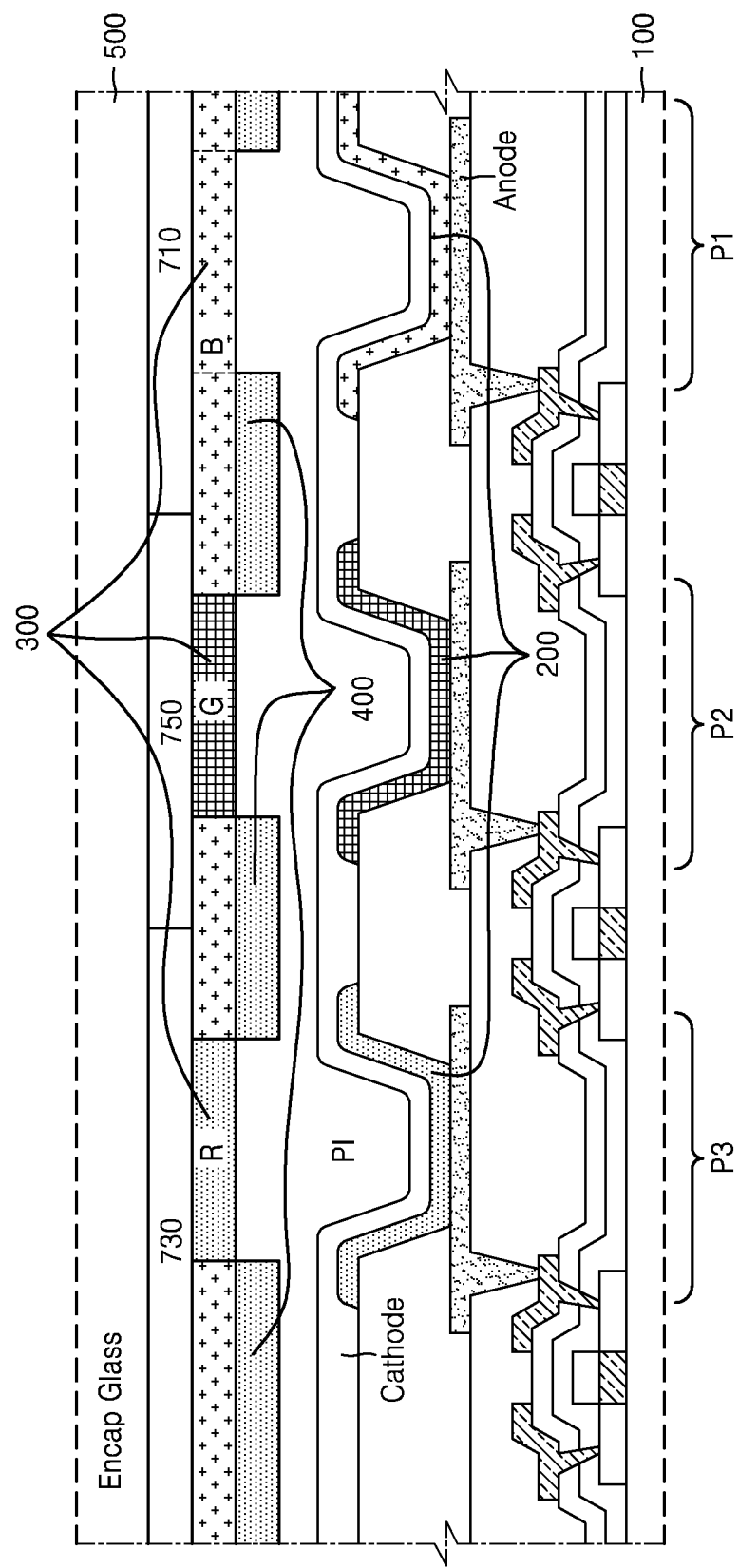
FIG. 6 is a cross-sectional diagram of an organic light-emitting display apparatus according to an exemplary embodiment of the present invention.

FIG. 6 is a cross-sectional diagram of an organic light-emitting display apparatus according to an exemplary embodiment of the present invention.

The organic light-emitting display apparatus according to an exemplary embodiment may include an intermediate layer 710, 730, 750. The intermediate layer 710, 730, 750 may include a blue intermediate layer 710, a red intermediate layer 730, and a green intermediate layer 750.

That is, the blue, red, and green intermediate layers 710, 730, and 750 having different refractive indices may be formed depending on a location of the color filter 300. That is, the blue, red, and green intermediate layers 710, 730, and 750 may be formed on the blue, red, and green color filters B, R, and G, respectively.

The blue intermediate layer 710 may be formed so as to have a refractive index between the refractive index of the blue color filter B and the refractive index of the upper substrate 500.

Likewise, each of the red intermediate layer 730 and the green intermediate layer 750 may be formed so as to have a refractive index between the refractive index of the red or green color filter R or G and the refractive index of the upper substrate 500.

In the organic light-emitting display apparatus according to an exemplary embodiment, when light incident from the outside passes through each of the red, green, and blue color filters R, G, and B, the light passes through the upper substrate 500 and the intermediate layer 700. Thus, an inter-layer refractive index difference may be minimized, thereby maximizing efficiency of the internal absorption of external light.

FIGS. 7A to 7D are cross-sectional diagrams describing a method of forming an upper substrate and a color filter in a method of manufacturing an organic light-emitting display apparatus, according to an exemplary embodiment of the present invention.

According to the method of manufacturing an organic light-emitting display apparatus, first, the organic light-emitting device 200 including a plurality of sub-pixels for respectively emitting lights of different colors may be formed (not shown). The upper substrate 500 located at an upper part so as to encapsulate the organic light-emitting device 200 may be formed (not shown).

As discussed in further detail below, the color filter 300 located in a region corresponding to the plurality of sub-pixels may be formed on the upper substrate 500. The color filter 300 may include the blue color filter B, the red color filter R, and the green color filter G.

Specifically, FIGS. 7A to 7D sequentially illustrate the forming of the color filter 300.

Figure 7A:
FIGS. 7A, 7B, 7C, and 7D are cross-sectional diagrams describing a method of forming an upper substrate and a color filter in a method of manufacturing an organic light-emitting display apparatus, according to an exemplary embodiment of the present invention.
Figure 7B:
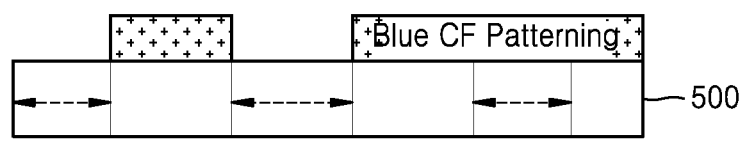

First, as shown in FIGS. 7A and 7B, the blue color filter B may be patterned on the upper substrate 500. The blue color filter B may be patterned not only in a region corresponding to a blue sub-pixel but also at a location corresponding to the non-emitting area. That is, the blue color filter B may be patterned in both a region between the region where the blue color filter B will be disposed and a region where the green color filter G will be disposed and in a region between the region where the green color filter G will be disposed and the region where the red color filter R will be disposed. As such an inter-layer refractive index difference is minimized when external incident light is absorbed, since the blue color filter B has almost the same refractive index as that of the upper substrate 500, in comparison to the green color filter G and the red color filter R.

Figure 7C:
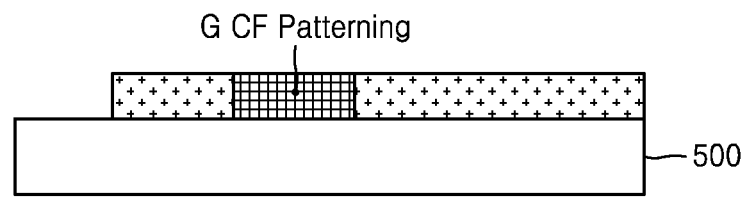

Next, as shown in FIG. 7C, the green color filter G may be patterned in a region corresponding to a green sub-pixel.

Figure 7D:
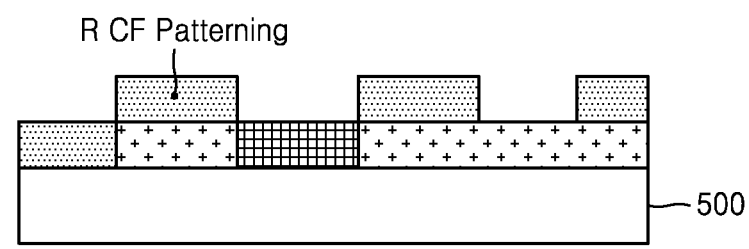

Next, as shown in FIG. 7D, the red color filter R may be patterned. The red color filter R may be patterned not only in a region corresponding to a red sub-pixel but also at a location corresponding to the non-emitting area.

That is, the red color filter R may be patterned as a second layer on the blue color filter B patterned as a first layer in the region between the blue color filter B and the green color filter G and the region between the green color filter G and the red color filter R.

In this case, since the patterned red color filter R protrudes more than the color filter 300 formed in an emitting area, the patterned red color filter R may increase the efficiency of internal absorption of external light and be a spacer maintaining a gap between the upper and lower substrates 500 and 100 (not shown).

The types and an order of color filters patterned at the location corresponding to the non-emitting area are not limited to the above. The method of manufacturing an organic light-emitting display apparatus illustrated in FIGS. 7A to 7D is merely one embodiment and is not limited thereto. For example, the green color filter G may also be patterned at the location corresponding to the non-emitting area.

In a case where the green color filter G is patterned at the location corresponding to the non-emitting area, the blue color filter B patterned as a first layer, the green color filter G as a second layer, and the red color filter R as a third layer may be stacked at the location corresponding to the non-emitting area. Accordingly, the blue, green, and red color filters B, G, and R at the location corresponding to the non-emitting area may protrude further than the color filter 300 at a location corresponding to the emitting area and may form a spacer.

FIGS. 8A to 8E are cross-sectional diagrams describing a method of manufacturing an organic light-emitting display apparatus, according to an exemplary embodiment. Steps similar to those described above with reference to FIG. 7A are omitted in this description.

Figure 8A:
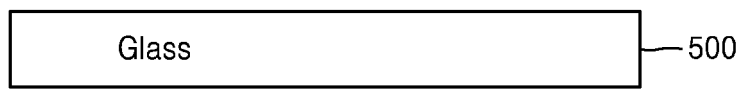
FIGS. 8A, 8B, 8C, 8D, and 8E are cross-sectional diagrams describing a method of manufacturing an organic light-emitting display apparatus, according to an exemplary embodiment of the present invention.
Figure 8B:
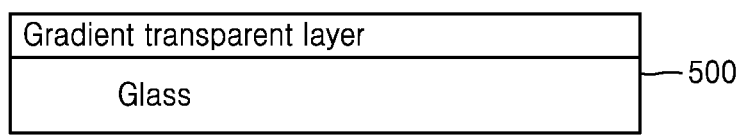
Figure 8C:
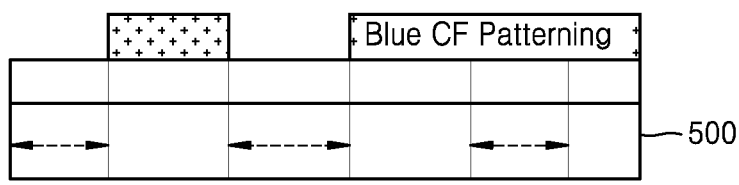
Figure 8D:
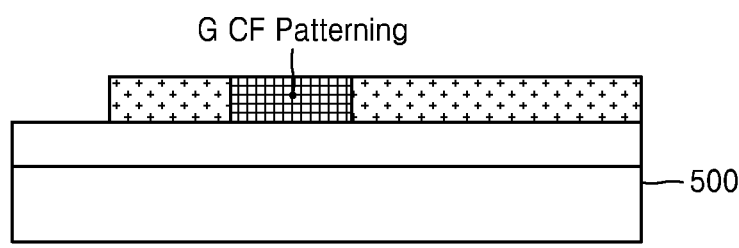
Figure 8E:
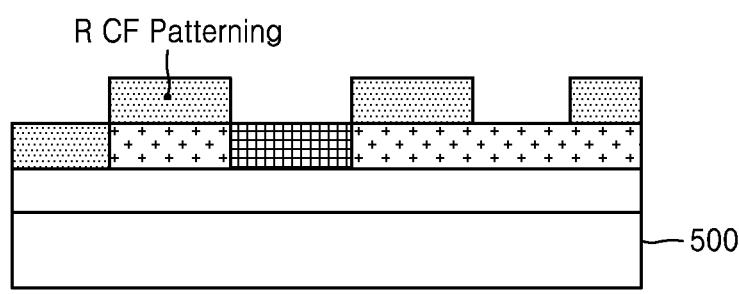

In the method of manufacturing an organic light-emitting display apparatus according to the exemplary embodiment, an intermediate layer may be first formed before forming the color filter 300 on the upper substrate 500 as shown in FIG. 8B.

The intermediate layer may be formed so as to have a refractive index between the refractive index of the color filter 300 and the refractive index of the upper substrate 500, thereby minimizing an inter-layer refractive index difference.

As described above, according to the one or more of the above embodiments, the reflection of external light may be reduced, and a manufacturing process may also be simplified.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting display apparatus, comprising:
   an organic light-emitting device comprising a plurality of sub-pixels, the sub-pixels configured to emit lights of different colors;
   a color filter disposed on the organic light-emitting device in a region corresponding to an emitting area of each sub-pixel of the plurality of sub-pixels, the color filter comprising a red color filter and a green color filter;
   a spacer color filter disposed in a non-light emitting area directly bound by the red color filter and the green color filter in the same plane, the spacer color filter comprising a material different from the red color filter and green color filter; and
   a substrate disposed on the color filter and encapsulating the organic light-emitting device.

2. The organic light-emitting display apparatus of claim 1, wherein the color filter further comprises a blue color filter and the spacer color filter comprises a first layer comprising the same material as the blue color filter.

3. The organic light-emitting display apparatus of claim 2, wherein the spacer color filter further comprises a second layer stacked on the first layer, and the second layer comprises the same material as the red color filter.

4. The organic light-emitting display apparatus of claim 2, wherein the spacer color filter further comprises second and third layers stacked on the first layer, wherein the second layer comprises the same material as the green color filter and the third layer comprises the same material as the red color filter.

5. The organic light-emitting display apparatus of claim 1, further comprising an intermediate layer disposed between the color filter and the substrate and having a refractive index between a refractive index of the color filter and a refractive index of the substrate.

6. The organic light-emitting display apparatus of claim 5, wherein the color filter further comprises a blue color filter and the spacer color filter comprises stacked first and second layers, the first layer comprising the same material as the blue color filter and the second layer comprising the same material as the red color filter.

7. The organic light-emitting display apparatus of claim 5, wherein the color filter further comprises a blue color filter and the spacer color filter comprises sequentially stacked first, second, and third layers, the first layer comprising the same material as the blue color filter, the second layer comprising the same material as the green color filter, and the third layer comprising the same material as the red color filter.

8. The organic light-emitting display apparatus of claim 5,
   wherein the color filter further comprises a blue color filter and the intermediate layer has a refractive index between a refractive index of the blue color filter and a refractive index of the substrate, and
   wherein a red intermediate layer pattern is disposed in the intermediate layer in an area corresponding to the red color filter.

9. The organic light-emitting display apparatus of claim 8, wherein the red intermediate layer pattern has a refractive index between a refractive index of the red color filter and the refractive index of the substrate.

10. The organic light-emitting display apparatus of claim 5, wherein the color filter further comprises a blue color filter and the intermediate layer has a refractive index between a refractive index of the blue color filter and a refractive index of the substrate, and wherein a green intermediate layer pattern is disposed in the intermediate layer in an area corresponding to the green color filter.

11. The organic light-emitting display apparatus of claim 10, wherein the green intermediate layer pattern has a refractive index between a refractive index of the green color filter and the refractive index of the substrate.

12. The organic light-emitting display apparatus of claim 5, wherein the color filter further comprises a blue color filter and the intermediate layer has a refractive index between a refractive index of the blue color filter and a refractive index of the substrate, and wherein a red intermediate layer pattern is disposed in the intermediate layer in an area corresponding to the red color filter, and a green intermediate layer pattern is formed in the intermediate layer at an area corresponding to the green color filter.

13. The organic light-emitting display apparatus of claim 12, wherein the red intermediate layer pattern has a refractive index between a refractive index of the red color filter and the refractive index of the substrate, and wherein the green intermediate layer pattern has a refractive index between a refractive index of the green color filter and the refractive index of the substrate.

14. The organic light-emitting display apparatus of claim 5, wherein the color filter further comprises a blue color filter and the intermediate layer comprises a green intermediate layer, a red intermediate layer, and a blue intermediate layer, and wherein the green, red, and blue intermediate layers are disposed on the green, red, and blue color filters, respectively.

15. The organic light-emitting display apparatus of claim 14, wherein the green intermediate layer has a refractive index between a refractive index of the green color filter and the refractive index of the substrate, the red intermediate layer has a refractive index between a refractive index of the red color filter and the refractive index of the substrate, and the blue intermediate layer has a refractive index between a refractive index of the blue color filter and the refractive index of the substrate.

16. An organic light-emitting display apparatus, comprising:

an organic light-emitting device comprising a plurality of sub-pixels, the sub-pixels configured to emit lights of different colors;

a color filter disposed on the organic light-emitting device in a region corresponding to an emitting area of each sub-pixel of the plurality of sub-pixels, the color filter comprising a red color filter and a green color filter;

a spacer color filter disposed in a non-emitting area directly bound by the red color filter and the green color filter in the same plane, the spacer color filter comprising a material different from the red color filter and the green color filter;

a substrate disposed on the color filter and encapsulating the organic light-emitting device; and an intermediate layer disposed between the color filter and the substrate and having a refractive index between a refractive index of the color filter and a refractive index of the substrate.

* * * * *